United States Patent [19]

Umeda et al.

[11] Patent Number: 5,041,342
[45] Date of Patent: Aug. 20, 1991

[54] MULTILAYERED CERAMIC SUBSTRATE FIREABLE IN LOW TEMPERATURE

[75] Inventors: Yuhji Umeda; Tadashi Otagiri; Go Suzuki, all of Nagoya, Japan

[73] Assignee: NGK Insulators, Ltd., Aichi, Japan

[21] Appl. No.: 375,919

[22] Filed: Jul. 6, 1989

[30] Foreign Application Priority Data

Jul. 8, 1988 [JP] Japan .................................. 63-169087
Sep. 22, 1988 [JP] Japan .................................. 63-236592

[51] Int. Cl.$^5$ .............................................. B32B 5/16
[52] U.S. Cl. ...................................... 428/632; 428/633
[58] Field of Search ................................ 428/632, 633

[56] References Cited

U.S. PATENT DOCUMENTS

| | | | |
|---|---|---|---|
| 3,975,165 | 8/1976 | Elbert et al. | 428/633 |
| 4,503,130 | 3/1985 | Bosshart et al. | 428/632 |
| 4,576,874 | 3/1986 | Spengler et al. | 428/632 |
| 4,642,148 | 2/1987 | Kuihara et al. | 501/7 |
| 4,695,517 | 9/1987 | Okuno et al. | 428/698 |
| 4,752,535 | 6/1988 | Kvernes | 428/632 |
| 4,764,341 | 8/1988 | Flaitz et al. | 428/633 |
| 4,778,726 | 10/1988 | Lavendel et al. | 428/632 |
| 4,849,379 | 7/1989 | McCormick | 501/32 |
| 4,849,380 | 7/1989 | Sawhill | 501/32 |
| 4,882,212 | 11/1989 | SinghDeo et al. | 501/32 |
| 4,898,791 | 2/1990 | Schurig | 428/632 |

FOREIGN PATENT DOCUMENTS

62-16598  1/1987  Japan .
62-25497  2/1987  Japan .
63-44751  2/1988  Japan .

Primary Examiner—R. Dean
Assistant Examiner—David Schumaker
Attorney, Agent, or Firm—Parkhurst, Wendel & Rossi

[57] ABSTRACT

In a multilayered ceramic substrate having a ceramic substrate fireable in low temperatures and a metal member for input/output brazed to the ceramic substrate, an intermediate layer including a ceramic component is arranged between the ceramic substrate and the metal member in such a manner that thermal coefficients $\alpha_1$, $\alpha_2$ and $\alpha_3$ between a room temperature and near a brazing temperature of the metal member, the ceramic component in the intermediate layer and the ceramic layer, respectively, maintains a relation of $\alpha_1 > \alpha_2 > \alpha_3$. Moreover, the ceramic substrate fireable in low temperatures is constructed by first ceramic layer having a flexural strength more than 25 kg/mm$^2$ and a second ceramic layer having a dielectric constant less than 7. In these constructions, the multilayered ceramic substrate having a sufficient adhesion strength between the metal member and the ceramic substrate and a good reliability can be obtained, while advantages of the ceramic substrate fireable in low temperatures can be maintained.

6 Claims, 1 Drawing Sheet

MULTILAYERED CERAMIC SUBSTRATE FIREABLE IN LOW TEMPERATURE

BACKGROUND OF THE INVENTION

1. Field of the Invention and Related Art Statements

The present invention relates to a multilayered ceramic substrate fireable at low temperatures.

Recently, there are various requirements for a multilayered ceramic substrate, such as lower signal propagation delay time, higher wiring density and installationability of a large chip, and thus it is necessary to achieve a low dielectric constant, a low electric resistivity and a low thermal expansion coefficient. To this end, use of a multilayered ceramic substrate fireable at low temperatures is gradually increased.

In the low temperature fireable multilayered ceramic substrates, a metal member is brazed to a ceramic substrate fireable at the low temperature through a metalizing layer so as to increase an adhesion strength between the ceramic substrate and the metal member.

In this case, a thermal expansion coefficient of the ceramic substrate fireable at low temperatures is generally low. Therefore, if use is made of a metal member made of a Kovar or an Fe-42Ni alloy (both of them having a large thermal expansion coefficient such as $\alpha$: about $10 \times 10^{-6}/°C$. at RT~800° C.), there occurs a drawback such that the adhesion strength between the metal member and the ceramic substrate is decreased due to a residual stress generated at a connection boundary between the metal member, and largely different thermal expansion coefficients between the ceramic substrate and metal member.

To eliminate the drawback mentioned above, in the Japanese Patent Laid-open Publication No. 63-44751, there is disclosed a technique such that, when a metal lead is brazed at a high temperature and connected to a ceramic substrate fireable at low temperatures, a copper member is arranged as a buffer member between the metal lead and the ceramic substrate.

However, even in the technique disclosed in Japanese Patent Laid-open Publication No. 63-44751, a large and sufficient adhesion strength between the metal lead and the ceramic substrate can not be obtained and thus the above drawbacks still remain.

Further, the low temperature fireable ceramic substrate has such advantages that the dielectric constant of the substrate can be made lower by suitably selecting glass compositions of a glass-ceramic composite body or a crystalline glass body. Therefore, in the multilayered wiring ceramic substrate, an increase of the signal propagation speed and an increase of the wiring density can be realized.

However, since a flexural strength of the low temperature fireable ceramic substrate is low, a sufficient adhesion strength between the metal member and the ceramic substrate can not be obtained, when the metal member for input/output terminals is brazed at a high temperature and connected to the ceramic substrate through the metalizing layer as is the same as the known method. This is because a residual stress is generated at the boundary region between the metal member and the ceramic substrate due to thermal stress on a high temperature soldering using for example an eutectic Ag solder, and thus a generation of micro cracks, in an extreme case, a breakage of the ceramic substrate occurs.

In order to eliminate the drawbacks mentioned above, the flexural strength of the ceramic substrate might be increased. To this end, when use is made of the glass-ceramic composite body as the low temperature fireable ceramic substrate, the following two methods have been known.

First, there is known a method wherein an amount of alumina included in the low temperature fireable ceramic substrate as a ceramic component is increased so as to increase the flexural strength of the ceramic substrate. Secondly, there is known a method wherein use is made of a leaded borosilicate glass as a glass component of the low temperature fireable ceramic substrate, and the glass component is crystallized so as to increase the flexural strength.

However, if the flexural strength of the ceramic substrate is increased by the above two methods, the flexural strength is increased, but a dielectric constant of the ceramic substrate becomes higher correspondingly. Therefore, there is a drawback that the advantage of the low temperature fireable ceramic substrate is reduced.

In order to eliminate the drawbacks mentioned above, there is known a technique in which an adhesion strength is made larger, in Japanese Patent Laid-open Publication No. 62-25497 and Japanese Patent Laid-open Publication No. 62-16598. That is to say, in the Japanese Patent Laid-open Publication No. 62-16598, a green sheet whose flexural strength after firing is larger than that of the ceramic substrate is arranged to the portion on which the metal terminal is connected so as to increase the adhesion strength. Further, in the Japanese Patent Laid-open Publication No. 62-25497, an insulation paste is fired with the metal terminal so as to increase the adhesion strength.

However, in the techniques disclosed in the above publications, since the green sheet or the insulation paste is not co-fired with the ceramic substrate, the adhesion strength is still not sufficient.

Further, in U.S. Pat. No. 4,695,517, there is disclosed a technique such that a first layer including W or Mo and a second layer including only W or Mo are co-fired with an AlN substrate so as to increase an adhesion strength between the metalizing layer and the ceramic substrate.

However, since use is made of W or Mo whose melting point is high, the technique disclosed in U.S. Pat. No. 4,695,517 is not directly applied to the present invention in which use is made of a low temperature fireable ceramic substrate.

SUMMARY OF THE INVENTION

An object of the present invention is to provide a multilayered ceramic substrate fireable in low temperatures in which a residual stress generated at a connection boundary can be suitably eliminated, and a sufficient adhesion strength between a metal member and a ceramic substrate can be maintained.

According to the invention, a multilayered ceramic substrate wherein a ceramic substrate fireable in low temperatures, an intermediate layer including a ceramic component and a metalizing layer to which a metal member is secured through a solder are arranged in this order, comprises a relation of $\alpha_1 > \alpha_2 > \alpha_3$ in thermal expansion coefficients between a room temperature and near brazing temperature, in which $\alpha_1$, $\alpha_2$ and $\alpha_3$ denote thermal expansion coefficients of the metal member, the ceramic component of the intermediate layer and the ceramic substrate, respectively.

In the above constructions, the low temperature fireable ceramic substrate means a ceramic substrate which is fireable at low temperatures and includes a metal layer made of at least one metal material selected from the group consisting of Cu, Ag, Au, Ag-Pd, Ni as an internal conductor. Moreover, as to the multilayered method, use may be made of a method wherein the above metal layer is co-fired with the ceramic substrate after the metal paste is printed on the ceramic green sheet, or a method wherein the metal layer is fired after the ceramic substrate is generated by the firing.

In the feature of the above present invention, a thermal expansion coefficient of the ceramic component included in an intermediate layer arranged between the ceramic substrate fireable at low temperatures and the metalizing layer is set to an intermediate value between the thermal expansion coefficients of the ceramic substrate and the metal member. Therefore, it is possible to reduce the residual stress generated at a connection boundary between respective layers due to a difference of the thermal expansion coefficients between the metal member and the ceramic substrate or the intermediate layer. In this case, the intermediate layer is arranged at least to the portion to which the metal member is secured.

Another object of the present invention is to provide a multilayered ceramic substrate fireable at low temperatures which is formed by a co-firing method and has a low dielectric constant and a high flexural strength.

According to the invention, a multilayered ceramic substrate having a ceramic substrate fireable in low temperatures and a metal member brazed to said ceramic substrate, comprises a first ceramic layer having a flexural strength more than 25 kg/mm$^2$ and a second ceramic layer having a dielectric constant less than 7, wherein said first ceramic substrate and said second ceramic substrate are co-fired as the ceramic substrate fireable at low temperatures.

In the above constructions according to the invention, the low temperature fireable ceramic substrate is constructed by two kinds of ceramic layers which are co-fired together, and a dielectric constant of one of the ceramic layers on which wiring conductors are arranged is decreased. Therefore, the signal propagation speed can be made higher even in the low temperature fireable ceramic substrate. Moreover, the ceramic substrate having a sufficient adhesion strength of the metal member can be realized by using the ceramic layer having a high flexural strength as the other ceramic layer on which the metal terminal for input/output connections.

DESCRIPTION OF THE PREFERRED EMBODIMENTS

Figure 1:
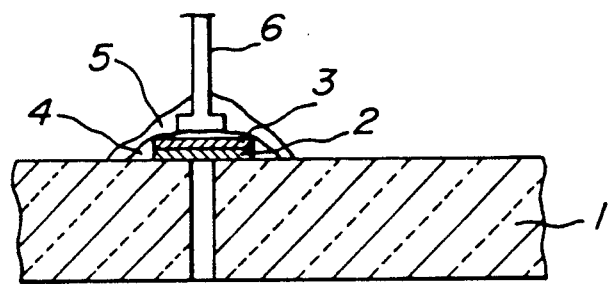
FIG. 1 is a cross sectional view showing one embodiment of a multilayered ceramic substrate fireable in low temperatures according to the invention.

One embodiment according to the invention will be explained with reference to the drawings.

At first, as for a glass material, a borosilicate glass consisting of 75% by weight of $SiO_2$, 3% by weight of $Al_2O_3$, 14% by weight of $B_2O_3$, 1% by weight of $Na_2O$, 3% by weight of $K_2O$ and 4% by weight of BaO, and a crystallized glass consisting of 45% by weight of $SiO_2$, 28% by weight of $Al_2O_3$, 5% by weight of $B_2O_3$, 14% by weight of MgO, 3% by weight of $ZrO_2$, 5% by weight of $P_2O_5$ are prepared.

Then, 30% by weight of quartz glass having an average particle size of 2~5 $\mu$m and 30% by weight of alumina having an average particle size of 2~5 $\mu$m are mixed with 40% by weight of borosilicate glass to make slurries. The mixing operation is performed in, for example, a pot mill under wet atmospheres about 15~20 hours by using an acrylic binder and a solvent such as toluene and ethanol.

The slurries are cast into a tape by a doctor blade method, and the tape is punched into a first green sheet 1 having a thickness of 0.6 mm. Further, a through hole punching operation is effected to the first green sheet 1. A thermal expansion coefficient of a ceramic substrate obtained by firing the first green sheet 1 at 1000° C. is $4.3 \times 10^{-6}$/°C. (RT~800° C.). In the same manner as mentioned above, with respect to 100% by weight of crystallized glass, mixing, casting, punching, through hole punching operations are performed to prepare a second green sheet 1 having a thickness of 0.6 mm. A thermal expansion coefficient of a ceramic substrate obtained by firing the second green sheet 1 at 920° C. is $2.5 \times 10^{-6}$/°C. (RT~800° C.).

Next, as for an intermediate layer 2, a borosilicate glass or a crystallized glass having an average particle size of 1~3 $\mu$m is mixed with alumina in the manner as shown in Table 1 to prepare a ceramic mixture. Then, the ceramic mixture is mixed in a triroll mill with Cu powders or Ag-Pd powders having an average particle size of 0.5~2 $\mu$m in the manner as shown in Table 1 by using an acrylic binder and a terpineol solvent to prepare a ceramic paste. Further, as for a metalizing layer 3, Cu powders or Ag-Pd powders or the like are mixed in a triroll mill by using an acrylic binder and a terpineol solvent to prepare a metalizing paste.

Next, the ceramic paste for the intermediate layer 2 and the metalizing paste for the metalizing layer 3 are arranged on the first or the second green sheet 1 by a screen printing method in such a manner that a thickness of respective paste layers is set to 5~20 $\mu$m. The thus obtained green sheets on which paste layers are arranged are stacked and pressed by desired numbers by means of a thermocompression bonding at 70~120° C. and under a compacting pressure of 10~100 kg/cm$^2$.

Then, the stacked and pressed green sheets are fired at a temperature of 900~1000° C. In this case, the firing is performed in a nitrogen atmosphere when use is made of Cu and in the atmosphere when use is made of Ag-Pd. Moreover, Ni is arranged on the metalizing layer 3 of the fired ceramic by an electric plating to form a nickel plate layer 4 having a thickness of 0.5~10 $\mu$m.

Further, as for the metal member for input/output connections, lead frames 6 (thickness of 0.25 mm, width of 1 mm) made of Kovar are brazed to the thus obtained multilayered ceramic substrate by using an eutectic Ag solder 5 made of Ag 72 wt % - Cu 28 wt % under a nitrogen atmosphere at about 800° C.

In order to examine the adhesion strength, a vertical pull-out test was performed with respect to the lead frames of the multilayered ceramic substrates. The vertical pull-out test was performed in the manner explained below. At first, use was made of a lead frame having a chucking part bent at 90° with respect to a main body thereof, and the multilayered ceramic substrate was formed in the manner mentioned above. Then, the ceramic substrate was fixed to the test machine and the chucking part was chucked by a cross head of the test machine. Under such a condition, the pull-out test was performed by moving the cross head at a tensile speed of 0.5 mm/min., and the pull-out strength was determined when the lead frame was peeled off from the ceramic substrate. Results of the vertical pull-out test were shown in Table 1.

layer 2 mainly consists of Cu or Ag-Pd. Further, the other metal component such as Au, Ag, Ni may be included in the metalizing layer 3 and the intermediate layer 2.

Moreover, from the results of the specimen Nos. 5 to 11 shown in Table 1, it is understood that, when an amount of Cu composition in the intermediate layer 2 is set to a value between 30~70 vol %, a sufficient adhesion strength above 2.5 kg/mm$^2$ can be obtained. Fur- TABLE 1(a)

| | Substrate | | Intermediate layer | | | | | |
|---|---|---|---|---|---|---|---|---|
| | | | Ceramic composition (wt %) | | | Ceramic total amount (vol %) | Metal composition (vol %) | | (*1) |
| No. | Composition | $a_3$ ($\times 10^{-6}/°C$) | Bolosilicate glass | Crystallized glass | Alumina | | Cu Total amount | Ag—Pd Total amount | $a_2$ ($\times 10^{-6}/°C$) |
| 1 | bolosilicate glass | 4.3 | 60 | | 40 | 58.8 | 41.2 | | 4.0 |
| 2 | | 4.3 | 50 | | 50 | 57.5 | 42.5 | | 4.3 |
| 3 | + quartz glass | 4.3 | 40 | | 60 | 56.1 | 43.9 | | 4.7 |
| 4 | + alumina | 4.3 | 30 | | 70 | 54.5 | 45.5 | | 5.1 |
| 5 | | 4.3 | 20 | | 80 | 79.7 | 20.3 | | 5.7 |
| 6 | | 4.3 | 20 | | 80 | 68.2 | 31.8 | | 5.7 |
| 7 | | 4.3 | 20 | | 80 | 63.6 | 36.4 | | 5.7 |
| 8 | | 4.3 | 20 | | 80 | 52.9 | 47.1 | | 5.7 |
| 9 | | 4.3 | 20 | | 80 | 39.6 | 60.4 | | 5.7 |
| 10 | | 4.3 | 20 | | 80 | 31.6 | 68.4 | | 5.7 |
| 11 | | 4.3 | 20 | | 80 | 22.5 | 77.5 | | 5.7 |
| 12 | | 4.3 | 10 | | 90 | 51.0 | 49.0 | | 6.3 |
| 13 | | 4.3 | 5 | | 95 | 50.1 | 49.9 | | 6.6 |
| 14 | | 4.3 | 20 | | 80 | 52.9 | 47.1 | | 5.7 |
| 15 | | 4.3 | 30 | | 70 | 100 | — | | 5.1 |
| 16 | crystallized glass | 2.5 | | 60 | 40 | 70.0 | | 30.0 | 3.5 |
| 17 | | 2.5 | | 60 | 40 | 60.0 | | 40.0 | 3.5 |
| 18 | | 2.5 | | 60 | 40 | 46.7 | | 53.3 | 3.5 |
| 19 | | 2.5 | | 40 | 60 | 57.9 | | 42.1 | 4.3 |

TABLE 1(b)

| No. | Metalizing layer | Firing temperature (°C.) | Metal member Materials | $a_1$ ($\times 10^{-6}/°C$) | Adhesion strength (kg/mm$^2$) | Comment |
|---|---|---|---|---|---|---|
| 1 | Cu | 1000 | Kovar | 10 | 0.9 | without the scope of the invention |
| 2 | Cu | 1000 | Kovar | 10 | 1.6 | without the scope of the invention |
| 3 | Cu | 1000 | Kovar | 10 | 2.6 | |
| 4 | Cu | 1000 | Kovar | 10 | 3.6 | |
| 5 | Cu | 1000 | Kovar | 10 | 2.3 | |
| 6 | Cu | 1000 | Kovar | 10 | 2.8 | |
| 7 | Cu | 1000 | Kovar | 10 | 4.6 | |
| 8 | Cu | 1000 | Kovar | 10 | 5.1 | |
| 9 | Cu | 1000 | Kovar | 10 | 4.8 | |
| 10 | Cu | 1000 | Kovar | 10 | 2.5 | |
| 11 | Cu | 1000 | Kovar | 10 | 2.2 | |
| 12 | Cu | 1000 | Kovar | 10 | 4.5 | |
| 13 | Cu | 1000 | Kovar | 10 | 3.9 | |
| 14 | Cu | (*2) | Kovar | 10 | 2.7 | |
| 15 | Cu | 1000 | Kovar | 10 | 2.2 | |
| 16 | Ag—Pd | 920 | Kovar | 10 | 3.7 | |
| 17 | Ag—Pd | 920 | Kovar | 10 | 4.3 | |
| 18 | Ag—Pd | 920 | Kovar | 10 | 4.0 | |
| 19 | Ag—Pd | 920 | Kovar | 10 | 3.8 | |

(*1) Thermal expansion coefficient of the ceramic included in the intermediate layer.
(*2) After fired the ceramic substrate at 1000° C., intermediate layer and metallizing layer were fired at 950° C.

From Table 1, it is understood that, if the thermal expansion coefficient of the ceramic included in the intermediate layer 2 is set to a value between those of the ceramic substrate 1 and the lead frame 6, the adhesion strength becomes larger. Especially, if the thermal expansion coefficient of the ceramic becomes near one half the value between those of the ceramic included in the intermediate layer 2 substrate 1 and the lead frame 6, the adhesion strength becomes larger correspondingly. Moreover, it is preferable that the intermediate layer 2 includes a metal component, and the metal component included in the metalizing layer 3 and the intermediate ther, from the results of the specimen Nos. 16 to 19, it is understood that when an amount of Ag-Pd composition in the intermediate layer 2 is set to a value between 30~42 vol %, a sufficient adhesion strength above 3.7 kg/mm$^2$ can be obtained. This is because an anchor effect is realized such that an anchor is nailed from the metalizing layer 3 to the intermediate layer 2 due to a reaction of the metal component of the intermediate layer 2 and the metalizing layer 3. Therefore, it is preferable that the intermediate layer 2 includes the same ceramic component as that of the low temperature fireable ceramic substrate 1 and also includes the same metal component as that of the metalizing layer 3.

As for the metal member 6, use may be made of various known I/O terminals used for a normal IC package etc. As for the materials of the metal member 6, use may be made of, for example, an Sn-Cu alloy, an Fe-Cu alloy, a W-Cu alloy and a Cu clad in addition to the above Kovar (Ni-Co-Fe alloy) and Fe-42Ni alloy. Moreover, as for the brazing material, use may be made of a solder, 72Ag-Cu eutectic Ag solder and the other various brazing material. As for the atmosphere of the brazing operation, use may be made of a vacuum atmosphere, a neutral atmosphere and a reduction atmosphere.

As mentioned above in detail, according to the embodiment mentioned above, since the ceramic included in an intermediate layer having an intermediate thermal expansion coefficient between those of the ceramic substrate and the metal member, the thermal stress can be reduced effectively and the metal member can be connected to the ceramic substrate with a sufficient adhesion strength. Therefore, the above embodiment can be effectively applied to an IC package etc.

Figure 2A:
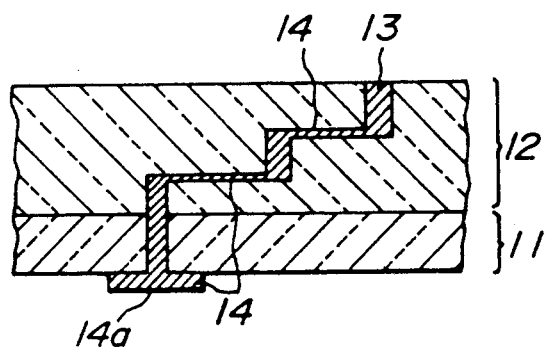
FIGS. 2a and 2b are cross sectional views respectively illustrating another embodiment of the multilayered ceramic substrate fireable at low temperatures according to the invention.
Figure 2B:
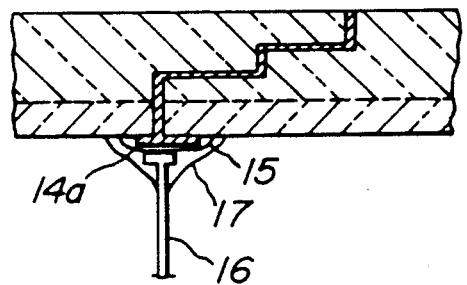

Next, the other embodiment according to the invention will be explained with reference to FIGS. 2a and 2b. As shown in FIGS. 2a and 2b, according to the present embodiment, the ceramic substrate is constructed by two ceramic layers having different properties.

At first, as for a glass component of the ceramic substrate, three kinds of glasses such as (1) borosilicate glass, (2) crystallized glass, (3) lead borosilicate glass were prepared as shown in Table 2.

TABLE 2

| Composition | No. Glass composition (wt %) | | |
|---|---|---|---|
| | 1 | 2 | 3 |
| SiO$_2$ | 75 | 45 | 56 |
| Al$_2$O$_3$ | 3 | 28 | 3 |
| B$_2$O$_3$ | 14 | 5 | 7 |
| Na$_2$O | 1 | | 2 |
| K$_2$O | 3 | | 2 |
| BaO | 4 | | |
| MgO | | 14 | 7 |
| ZrO$_2$ | | 3 | 5 |
| P$_2$O$_5$ | | 5 | |
| CaO | | | 4 |
| PbO | | | 17 |

Then, three kinds of glass powders shown in Table 2 were mixed with alumina powders and quartz glass powders at a mixing ratio shown in Table 3 to prepare the slurries. The slurries thus obtained were formed, by the doctor blade method, into green sheets each consisting of ceramic layers each having various dielectric constants and various flexural strength.

The flexural strength of the ceramic substrate was measured by the testing methods for flexural strength using three suport points (one is a load point and both ends are support points) with respect to a specimen having a width of 8 mm, a length of 40 mm, and a thickness of 0.8 mm. Moreover, the dielectric constant was measured according to JIS K6911.

TABLE 3

| | Composition and properties of ceramic fireable in low temperature | | | | |
|---|---|---|---|---|---|
| No. | Composition (wt %) | | Firing temperature (°C.) | Dielectric constant (1 MHz) | Signal propagation delay time (ns/m) | Flexural strength (kg/mm$^2$) |
| 4 | No. 1 | 40 | 1000 | 5.4 | 7.7 | 19 |
| | Quartz glass | 30 | | | | |
| | Alumina | 30 | | | | |
| 5 | No. 1 | 40 | 1000 | 7.3 | 9.0 | 25 |
| | alumina | 60 | | | | |
| 6 | No. 1 | 50 | 900 | 6.7 | 8.6 | 22 |
| | Alumina | 50 | | | | |
| 7 | No. 2 | 100 | 900 | 5.2 | 7.6 | 17 |
| 8 | No. 3 | 50 | 900 | 7.8 | 9.3 | 30 |
| | Alumina | 50 | | | | |

Then, a combination of the ceramic green sheets shown in Table 3 was selected in such a manner that, referring to FIG. 2a, a green sheet for a first ceramic layer 11 had larger flexural strength than that of a green sheet for a second ceramic layer 12. The combinations thus selected were shown in Table 4 together with comparison embodiments.

In the embodiment shown in FIG. 2a, the first ceramic layer 11 was formed in such a manner that a through hole punching was effected with respect to the green sheet by using metal molds, and a conductive paste 13 was arranged into the through holes. The second ceramic layer 12 was formed by the steps of punching the through holes with respect to the green sheets, arranging the conductive paste 13 into the through holes, and screen printing a desired number of conductive pastes 14 for a wiring conductor and insulation pastes for an insulation layer in such a manner that the conductive layers are electrically conductive with each other to make a multilayered portion. In this case, it should be noted that the through holes of the first ceramic layer 11 and the second ceramic layer 12 were also electrically conductive under the superposing condition. Moreover, it is preferable that a thickness of the first ceramic layer 11 is set to a value of 10~800 μm.

The first ceramic layer 11 and the second ceramic layer 12 were stacked and pressed with each other by a thermocompression bonding during 5 minutes under a temperature of 120° C. and a stress of 50 kg/cm$^2$ as shown in FIG. 2a. Successively, the first and second ceramic layers were co-fired at a temperature shown in Table 4. Then, as shown in FIG. 2b, an electroplating layer 15 of Ni was arranged to a pad portion 14a of the wiring conductor, having a diameter of 2 mm. Further, a lead pin 16 made of Kovar and having a diameter of 0.3 mm was brazed to the pad portion 14a. The brazing was performed by using an eutetic Ag solder 17 under the condition that the ceramic substrate and the lead pin were maintained during 5 minutes in an atmosphere of Ni and a temperature of 800° C.

TABLE 4

| | No. | Composition of ceramic green sheet (A) | Composition of ceramic green sheet (B) (*1) | Conductor composition | Firing temperature (°C.) | Adhesion strength of lead pin (kg/mm²) |
|---|---|---|---|---|---|---|
| Embodiments | 9 | No. 4 | No. 5 | Cu | 1000 | 3.7 |
| | 10 | No. 6 | No. 8 | Ag—Pd | 900 | 3.2 |
| | 11 | No. 7 | No. 8 | Ag—Pd | 900 | 3.4 |
| Comparisons | 12 | No. 4 | — | Cu | 100 | 1.7 |
| | 13 | No. 7 | — | Ag—Pd | 900 | 1.2 |
| | 14 | No. 4 | No. 8 | Ag—Pd | 900 (*2) | 1.8 |

(*1) Ceramic green sheet (B) was formed on ceramic green sheet (A) by a green sheet laminating or a screen printing.
(*2) After fired ceramic green sheet (A) of No. 4 at 1000° C., ceramic green sheet (B) of No. 8 was fired at 900° C.

In order to examine the adhesion strength of the lead pin with respect to the multilayered ceramic substrate, the vertical pull-out test was performed in the manner explained above. At first, the ceramic substrate was fixed to the test machine and the lead pin was chucked by a cross head of the test machine. Under such a condition, the pull-out test was performed by moving the cross head at a tensile speed of 0.5 mm/min., and the pull-out strength was determined when the lead pin was peeled off from the ceramic substrate. Results of the pull-out test were shown in Table 4 as a lead pin adhesion strength.

As for the comparison embodiments, use was made of one layer of the low temperature fireable ceramic substrate having a relatively low flexural strength, and the multilayered ceramic substrate was formed by the same manner as that of the present invention. Further, use was made of the comparison embodiments wherein the first ceramic layer was not co-fired with the second ceramic layer. The vertical pull-out test was performed with respect to those comparison embodiments as is the same as the embodiment mentioned above.

As clearly understood from the adhesion strengths of the lead pin shown in Table 4, in the comparison embodiment using the one-layered ceramic substrate having the low flexural strength, a sufficient adhesion strength can not be obtained as compared with the embodiment according to the invention. Moreover, when the first ceramic layer was not co-fired with the second ceramic layer, the adhesion strength between the first ceramic layer and the second ceramic layer is not sufficient as compared with the embodiment according to the invention wherein the first and second ceramic layers are co-fired. Therefore, the first ceramic layer is peeled off from the second ceramic layer, and thus a sufficient adhesion strength of the lead pin can not be obtained.

In the embodiment mentioned above, the second ceramic layer was formed by laminating the ceramic green sheets, but it is possible to form the second ceramic layer by a screen printing. Even in this case, the same results as shown in Table 4 can be obtained.

As mentioned above in detail, according to the embodiment mentioned above, the low temperature fireable multilayered ceramic substrate is constructed by two kinds of ceramic layers each having different properties, and the dielectric constant of the second ceramic layer is lowered, which is a main signal propagation side of the multilayered ceramic substrate. Therefore, the signal propagation can be made higher in the low temperature fireable ceramic substrate.

Further, according to the embodiment, since the first ceramic layer on which the metal member for input/output terminal has high flexural strength, and the first and second ceramic layers are co-fired, sufficient adhesion strength of the metal member can be obtained. Therefore, it is possible to obtain the multilayered ceramic substrate having good signal propagation properties and reliabilities of the metal member for input/output, and thus the present invention can be applied to a high performance IC package etc.

We claim:

1. A multilayered ceramic substrate comprising:
   a ceramic substrate fireable at low temperatures, said ceramic substrate having a thermal expansion coefficient $\alpha_3$;
   an intermediate layer arranged on a surface of said ceramic substrate, said intermediate layer comprising a ceramic component and at least one metal material selected from the group consisting of Cu, Au, Ag, Ag-Pd and Ni, said ceramic component of said intermediate layer having a thermal expansion coefficient $\alpha_2$;
   a metallizing layer arranged on said intermediate layer; and
   a metal member secured to said metallizing layer through a solder material, said metal member having a thermal expansion coefficient $\alpha_1$;
   wherein $\alpha_1 > \alpha_2 > \alpha_3$ in a temperature range between room temperature and near a brazing temperature of said solder material.

2. A multilayered ceramic substrate according to claim 1, wherein said ceramic component included in said intermediate layer is a composition of borosilicate glass and alumina or a composition of crystallized glass and alumina.

3. A multilayered ceramic substrate according to claim 1, wherein a total amount of said metal material is 30~70 vol %.

4. A multilayered ceramic substrate having a ceramic substrate fireable at low temperatures and a metal member brazed to said ceramic substrate, comprising a first ceramic layer having a flexural strength more than 25 kg/mm² and a second ceramic layer having a dielectric constant less than 7, wherein said first ceramic substrate and said second ceramic substrate are co-fired as the ceramic substrate fireable at low temperatures.

5. A multilayered ceramic substrate according to claim 4, wherein said first ceramic layer is made of a composition of borosilicate glass, quartz glass and alumina; or a composition of borosilicate glass and alumina; or quartz glass.

6. A multilayered ceramic substrate according to claim 4, said second ceramic layer is made of a composition of borosilicate glass and alumina or a composition of lead borosilicate glass and alumina.

* * * * *